United States Patent
Siktberg et al.

(10) Patent No.: US 6,988,819 B2
(45) Date of Patent: *Jan. 24, 2006

(54) LAMP HOUSING CONTAINING AN INTEGRATED LED SUPPORT STRUCTURE

(75) Inventors: Fred D. Siktberg, Indianapolis, IN (US); Jerry D. Heiniger, Anderson, IN (US)

(73) Assignee: Guide Corporation, Pendleton, IN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 8 days.

(21) Appl. No.: 10/656,542

(22) Filed: Sep. 5, 2003

(65) Prior Publication Data

US 2005/0052865 A1    Mar. 10, 2005

(51) Int. Cl.
*F21V 21/00* (2006.01)
(52) U.S. Cl. .................. 362/545; 362/240; 362/311
(58) Field of Classification Search ............. 362/545, 362/311, 226, 800, 240; 313/512
See application file for complete search history.

(56) References Cited

U.S. PATENT DOCUMENTS

| | | | |
|---|---|---|---|
| 4,152,624 A * | 5/1979 | Knaebel .................. 313/499 |
| 4,935,665 A | 6/1990 | Murata | |
| 5,038,255 A * | 8/1991 | Nishihashi et al. .......... 362/547 |
| 5,101,326 A * | 3/1992 | Roney .................. 362/545 |
| 5,122,943 A * | 6/1992 | Pugh .................. 362/256 |
| 5,136,483 A | 8/1992 | Schoniger et al. | |
| 5,161,872 A * | 11/1992 | Sasaki et al. .............. 362/29 |
| 5,404,282 A | 4/1995 | Klinke et al. | |
| 5,427,532 A | 6/1995 | Owen et al. | |
| 5,471,371 A * | 11/1995 | Koppolu et al. ............ 362/555 |
| 5,746,497 A | 5/1998 | Machida | |
| 6,061,160 A * | 5/2000 | Maruyama ................. 398/201 |
| 6,076,950 A * | 6/2000 | Topping et al. ............ 362/545 |
| 6,170,963 B1 | 1/2001 | Arnold | |
| 6,270,236 B1 | 8/2001 | Brussog | |
| 6,441,943 B1 | 8/2002 | Roberts et al. | |
| 6,705,745 B1 * | 3/2004 | Pederson ................. 362/284 |
| 6,787,994 B2 * | 9/2004 | Cok ..................... 313/512 |

* cited by examiner

*Primary Examiner*—Ali Alavi
(74) *Attorney, Agent, or Firm*—Ice Miller

(57) ABSTRACT

A lamp assembly with an integrated Light Emitting Diode support frame is described. An electrically conductive lead frame is encapsulated in between the interior and exterior surfaces of a lamp housing. Surface mounted LED light sources and associated drive components are attached to the lead frame, and thus to the housing. A positive terminal and a negative terminal are formed from the lead frame on the inside to the outside of the housing, so that electricity may be transmitted from an external source to the LED light sources on the inside of the housing. The LED light sources are energized by the conductive lead frame formed into or onto the housing, thus eliminating the need for a separate printed circuit board with a conductive lead frame.

12 Claims, 6 Drawing Sheets

LAMP HOUSING CONTAINING AN INTEGRATED LED SUPPORT STRUCTURE

BACKGROUND

Light Emitting Diodes ("LEDs") are gaining favor as light sources in the automotive industry because of increased efficiency and longevity over traditional incandescent or arc discharge light sources.

A current method of using LED light sources in automobile lamp assemblies involves creating a printed circuit board ("PCB"), an electrically insulating material with an inlaid conductive lead frame. The conductive lead frame defines a circuit, to which LED light sources and related drive components are attached. The conductive lead frame also creates electrical attachment points, for terminals or a wire harness, to enable electricity from outside the lamp to be carried to the LED light sources. The LED light sources and related drive components are attached to the side of the PCB facing outwardly. The PCB is then attached to the inside of the lamp assembly.

The attachment of LED light sources to a PCB requires the manufacture of the PCB, attachment of the LED light sources, related drive components to the PCB; attachment of the PCB to the inside of the lamp assembly, and the attachment of the terminals or the wire harness to connect to the automobile's electrical system. The addition of a PCB to the lamp assembly increases the overall weight of the lamp assembly, adds additional complexity to the lamp assembly, and increases the overall size requirements of the lamp assembly.

An improved lamp assembly would eliminate the need for a PCB, and instead place the conductive lead frame directly on the inside of the lamp housing. Surface mounted LED light sources would then be attached directly to the lead frame in the housing. The placement of the conductive lead frame directly on the inside of the housing removes the requirement for a separate PCB, reducing the complexity and the overall weight of the lamp assembly, and also allows the lamp assembly to be more compact. A more compact lamp assembly allows the automobile manufacturer more design flexibility and potential savings in sheetmetal and manufacturing costs.

DETAILED DESCRIPTION

One embodiment of a lamp housing 10 containing an integrated LED support structure is provided as shown in FIGS. 1 through 6, and is generally indicated as numeral 8.

Figure 1:
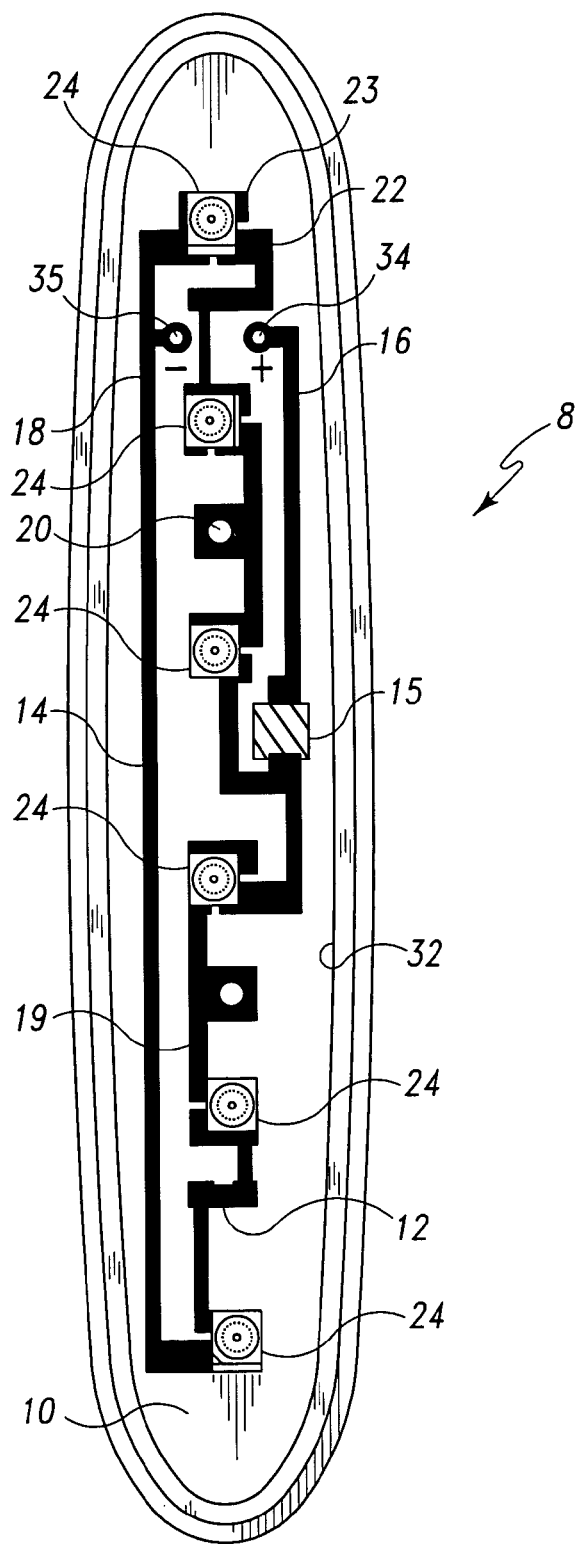
FIG. 1 is front cross sectional view of a first embodiment of a lamp assembly in accordance with the present invention.
Figure 2:
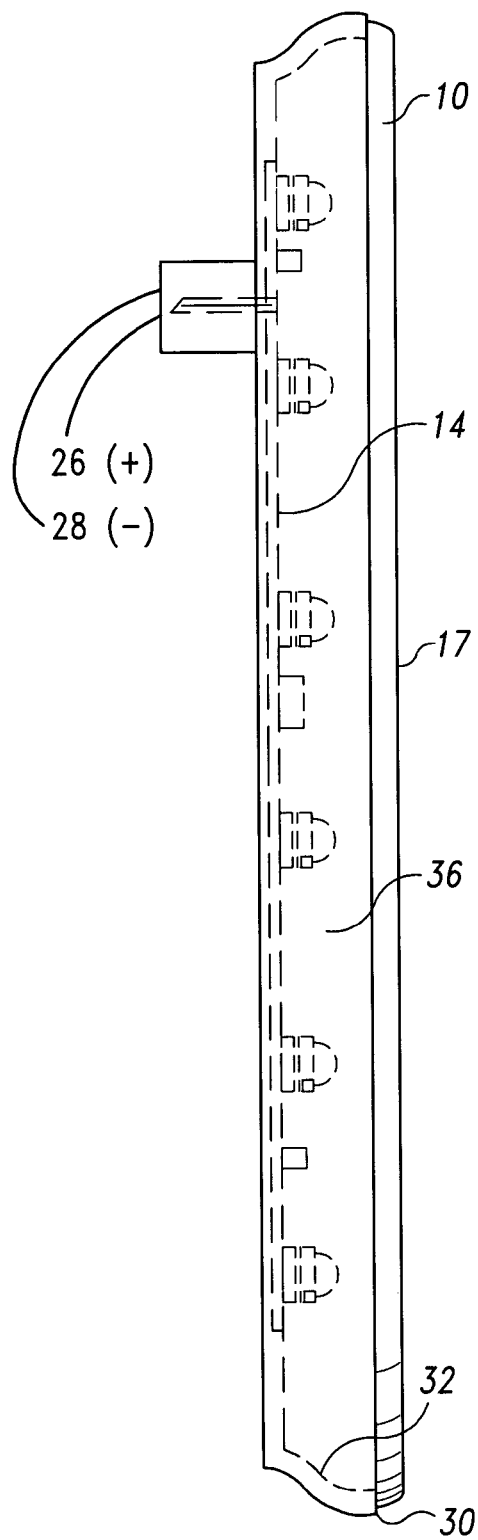
FIG. 2 is a side cross sectional view of the lamp assembly of FIG. 1.
Figure 3:
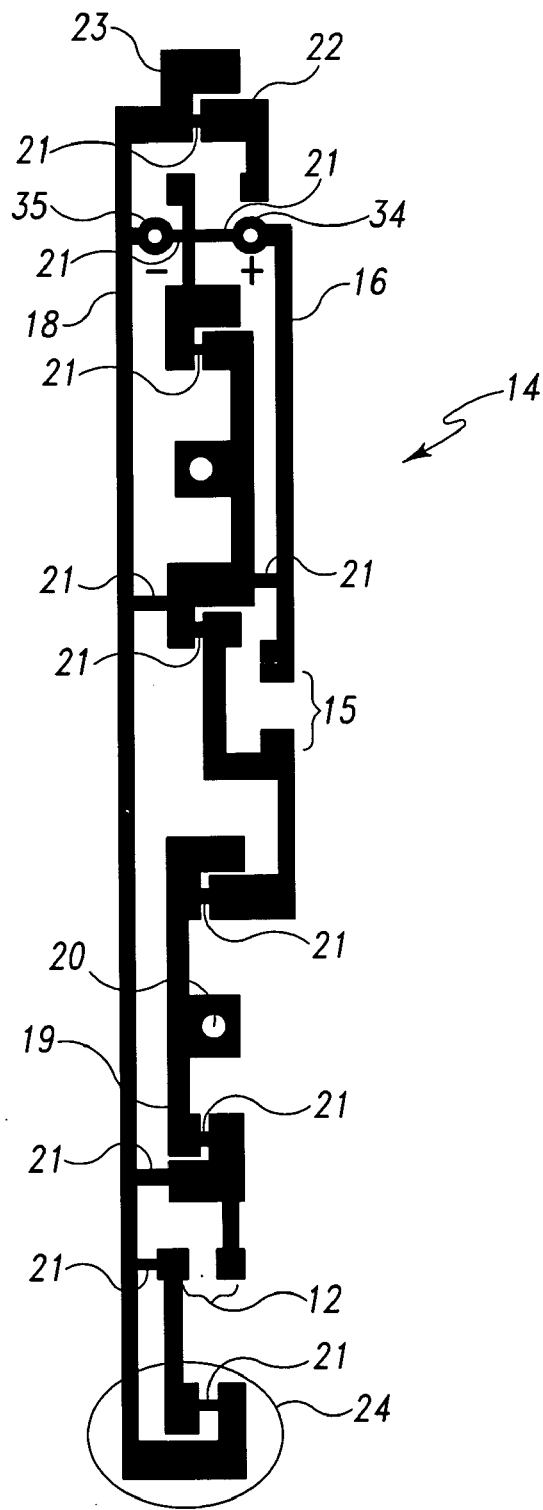
FIG. 3 is a component view of the circuit frame as shown in FIG. 1.
Figure 4:
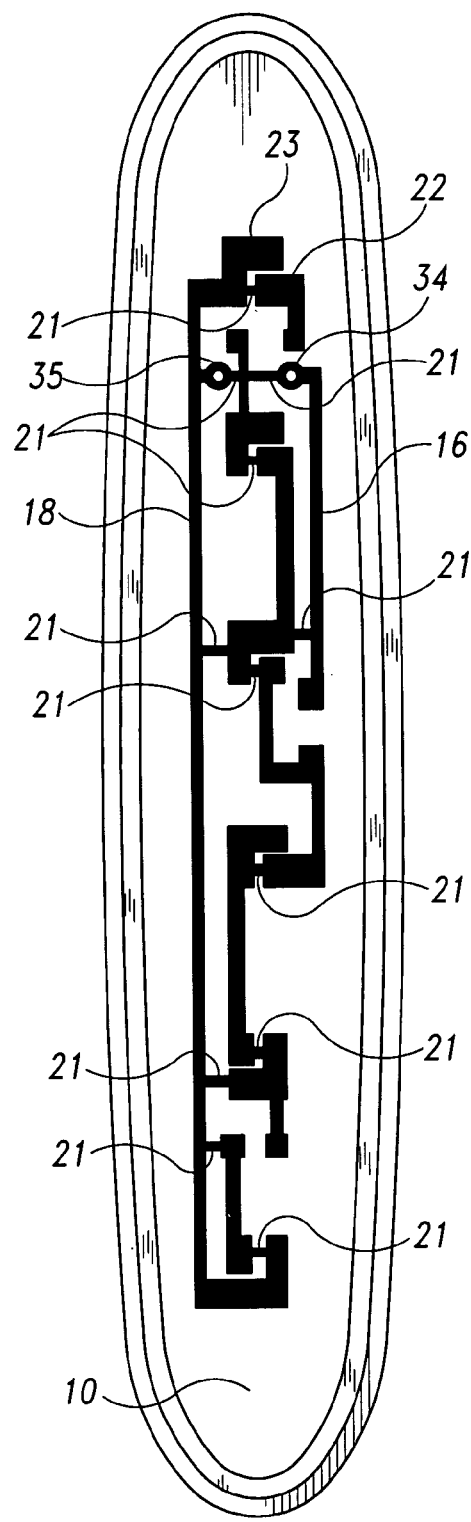
FIG. 4 is a front cross sectional view of the lamp assembly of FIG. 1, showing the lead frame without the LED light sources and related drive components.
Figure 5:
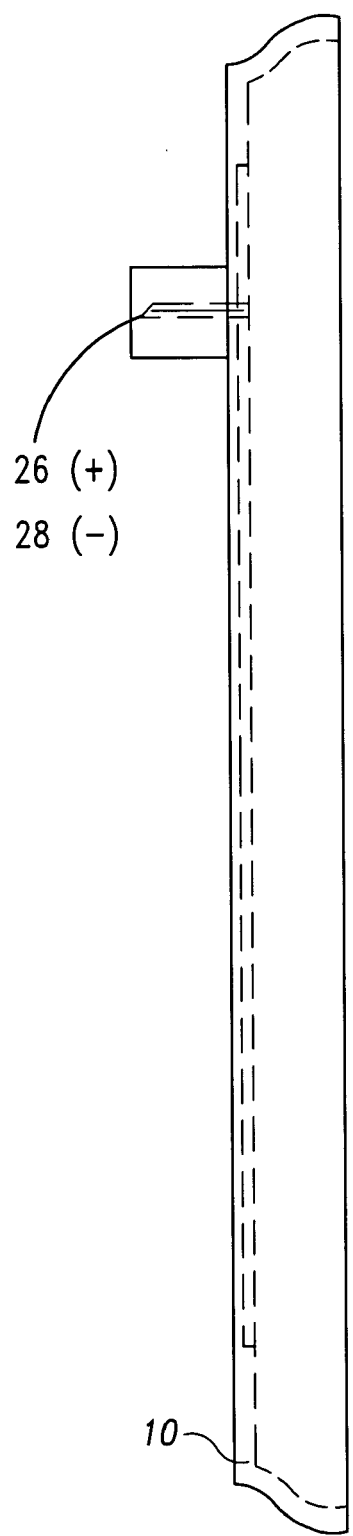
FIG. 5 is a side cross sectional view of the lamp assembly of FIG. 4.
Figure 6:
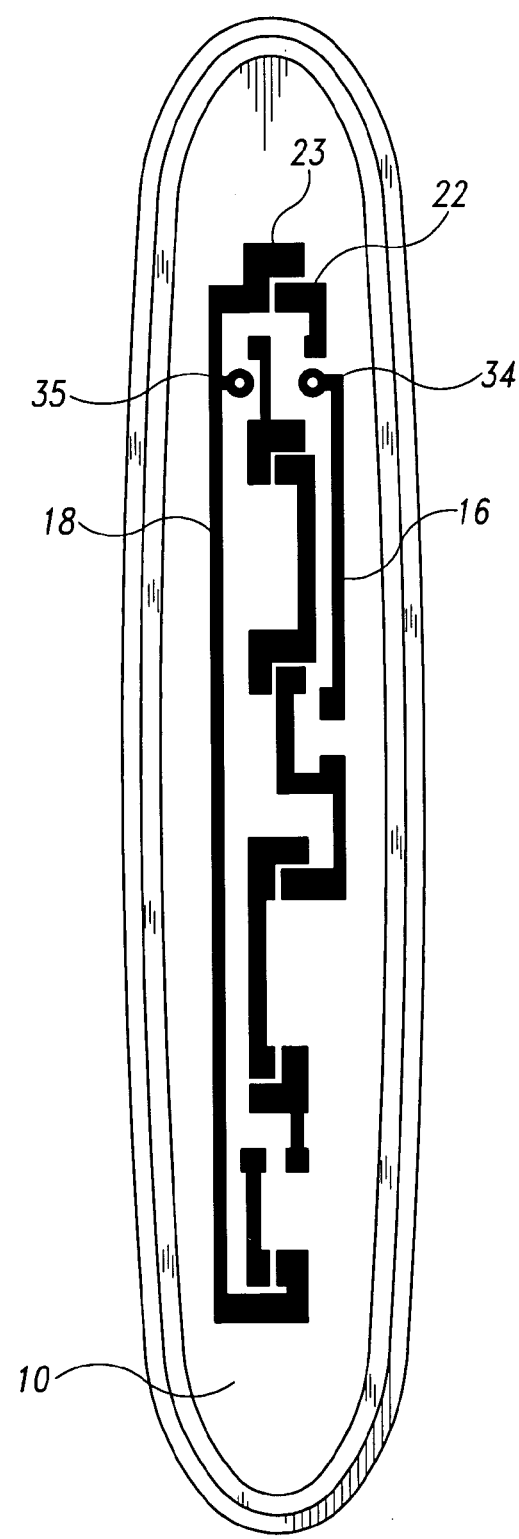
FIG. 6 is a front cross sectional view of the lamp assembly of FIG. 4, showing the lead frame without the conductive tie bars.

With reference to FIG. 1, a LED support structure integrated into a lamp housing 10 comprises a conductive lead frame 14 molded into the housing 10. With reference to FIG. 3, the conductive lead frame 14 comprises terminal holes 34 and 35, a positive lead line 16, a negative lead line 18, LED light source interconnection leads 19, location holes 20, and positive and negative connection pads 22 and 23 molded into the housing 10. Line 16 feeds a reverse voltage protection diode 15, which feeds multiple parallel series strings of LED light sources 24 and load resistors 12. The reverse voltage protection diode 15 and the load resistors 12 are defined to control LED light source drive current. Line 18 provides the negative return for the LED light source series strings. The conductive lead frame 14 as shown in FIG. 3, is held together as one piece during manufacturing using multiple "tie bars" 21. After insert molding the housing 10 and lead frame 14 as shown in FIG. 4, the lead frame "tie bars" 21 must be removed, as shown in FIG. 6. LED light sources 24 are attached to the exposed surface of the insert molded lead frame 14 via the connection pads 22 and 23 via soldering or any other suitable method so that the LED light source is electrically connected to pads 22 and 23. As shown in FIGS. 1 and 2, positive terminal 26 and a negative terminal 28 are insert molded or mechanically inserted in the housing 10, and are electrically connected to the leads 16 and 18, respectively, via holes 34 and 35 in lead frame 14. Electricity may therefore pass through the positive terminal 26, to the positive lead line 16, to reverse voltage diodes 15, through each LED light source 24 and load resistor 12, through negative lead line 18, and exit the lamp assembly through the negative terminal 28. A lens 17 is attached to the lamp housing, protecting the inside of the lamp housing 10. Lens 17 can focus or otherwise condition the light emitted from the lamp assembly 8.

The housing 10 has an interior surface, an exterior surface, and a housing opening 30. The edges of the housing 10 and the lens 17 abut one another, and are sealed together so that the interior of the housing 10 is protected. The seal may be accomplished in one of a number of ways well known in the art. The union of the housing 10 and the lens 17 defines a cavity 36. The lens 17 is manufactured from a transparent material, and may have optics integrated therein, which serve to focus or angle emitted light rays. The lens 17 may also be made from a material which allows light of a certain wavelength or range of wavelengths to pass, therefore imparting a distinct color to light radiated outside of the cavity 36. While the housing 10 is shown to be generally rectangular, it should be recognized that the housing 10 can be formed in any desired shape and the interior surface 32 can be formed to focus light rays in a desired pattern. The reflector 32 faces the cavity 36, and may be formed by coating a portion of the inside housing 10 with a material which reflects light rays. Techniques for coating the inside surface of the housing 10 with a reflective material, or forming the housing 10 out of a reflective material, are well known in the art. Alternatively, the reflector 32 could be formed separately from the housing 10, and mounted within the housing 10. The reflector 32 could also be formed to have reflector cavities for each LED light source. The reflector 32 could also be replaced with an inner lens using recognized optical techniques to focus the light in any desired pattern.

Referring now to FIGS. 1 and 6, an alternate embodiment of the present invention consists of forming the lead frame 14 by depositing an electrically conductive material on the surface of the housing 10. This deposition can be accomplished by using thick film technology, a method well known in the art. The deposition of the lead frame 14 in this way eliminates the need for the "tie bars" 21.

A second alternate embodiment of the present invention consists of forming the lead frame 14 by using a two shot molding technique followed with a metal coating procedure. The housing 10 is initially molded with lead frame 14 feature grooves molded in the surface of the housing 10. A secondary molding operation fills the grooves with a plastic material which may accept a metal coating. The subsequent metal coating process forms the electrically conductive circuit traces and pads in the surface of the housing 10. The deposition of the lead frame 14 in this way also eliminates the need for the "tie bars" 21.

As can be readily seen, the present invention of integrating a LED support structure into a lamp assembly obviates the need for a separate printed circuit board on which to attach the LED light sources. Eliminating the separate PCB reduces size, weight, and complexity of the lamp assembly. Utilizing the present invention with an automobile reduces the overall weight of the automobile, reduces maintenance of the lamp assemblies, and reduces cost by eliminating components.

Although other advantages may be found and realized and various modifications may be suggested by those versed in the art, it is understood that the present invention is not to be limited to the details given above, but rather may be modified within the scope of the appended claims.

We claim:

1. A lamp assembly comprising:
   a. a housing having an interior surface and an exterior surface;
   b. a conductive lead frame insert molded so that the conductive lead frame is encapsulated in between the interior surface and the exterior surface of the housing, the conductive lead frame having at least one positive connection pad, located at the interior surface of the housing, at least one negative connection pad located substantially adjacent to the at least one positive connection pad at the interior surface of the housing, and a means to electrically communicate the at least one positive connection pad and the at least one negative connection pad to the exterior surface of the housing so that electricity can pass through the lead frame and the at least one positive connection pad and at least one negative connection pad; and
   c. at least one light emitting diode light source positioned inside the housing and electrically connected across the at least one negative connection pad and the at least one positive connection pad.

2. The lamp assembly of claim 1, further comprising LED drive components electrically connected across the at least one negative connection pad and the at least one positive connection pad.

3. The lamp assembly of claim 1, further comprising a lens attached to the housing.

4. The lamp assembly of claim 1, wherein the interior surface is formed into a reflector arranged to reflect light emitted from the at least one light emitting diode light source out of the housing in a desired pattern.

5. The lamp assembly of claim 1, where the at least one light emitting diode light source may be operable to emit light of any wavelength.

6. The lamp assembly of claim 1, where the conductive lead frame comprises a positive lead line and a negative lead line electrically connected respectively to the at least one positive connection pad and the at least one negative connection pad.

7. The lamp assembly of claim 6, wherein the means for electrically communicate the at least one positive connection pad and at least one negative connection pad comprises a positive terminal extending from the exterior of the housing and electrically connected to the positive lead line, and a negative terminal extending from the exterior surface of the housing and electrically connected to the negative lead line, where the positive terminal and the negative terminal can be connected to an external source of electricity.

8. A method for manufacturing a lamp assembly, the method comprising the steps of:
   a. providing a conductive lead frame, the conductive lead frame comprising at least one positive connection pad and at least one negative connection pad;
   b. inserting the conductive lead frame into a molding cavity;
   c. molding a housing with an interior surface and an exterior surface around the lead frame in the molding cavity by injecting a plastic resin into the molding cavity, so that the conductive lead frame is encapsulated by the housing and the at least one positive connection pad and at least one negative connection pad extend to the interior surface of the housing;
   d. removing the housing with the lead frame molded therein from the molding cavity; and
   e. electrically connecting at least one light emitting diode to the lead frame across said at least one positive connection pad and said at least one negative connection pad inside the housing.

9. The method of claim 8, wherein the provided lead frame further comprises a plurality of terminal holes, at least one positive lead line, and at least one negative lead line electrically connected to one another and the at least one positive connection pad and at least one negative connection pad.

10. The method of claim 9, wherein the provided lead frame further comprises a plurality of tie bars that hold the lead frame together.

11. The method of claim 10, further comprising the step of removing the tie bars from the lead frame.

12. The lamp assembly of claim 1, wherein the light emitting diode light source may be operable to emit light of any combination of wavelengths.

* * * * *